(12) United States Patent
Robert Safavi et al.

(10) Patent No.: US 12,155,476 B2
(45) Date of Patent: Nov. 26, 2024

(54) TRANSMITTING AND RECEIVING DEVICES FOR RELIABLE RECEPTION OF CONTROL MESSAGES

(71) Applicant: Huawei Technologies Co., Ltd., Shenzhen (CN)

(72) Inventors: Anahid Robert Safavi, Kista (SE); Alberto Giuseppe Perotti, Segrate (IT); Branislav M. Popovic, Kista (SE); Thorsten Schier, Lund (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 835 days.

(21) Appl. No.: 17/149,462

(22) Filed: Jan. 14, 2021

(65) Prior Publication Data
US 2021/0135784 A1 May 6, 2021

Related U.S. Application Data

(63) Continuation of application No. PCT/EP2018/079812, filed on Oct. 31, 2018.

(51) Int. Cl.
*H04L 1/00* (2006.01)
*H04L 1/1867* (2023.01)

(52) U.S. Cl.
CPC .......... *H04L 1/0061* (2013.01); *H04L 1/0072* (2013.01); *H04L 1/1896* (2013.01)

(58) Field of Classification Search
CPC .... H04L 1/0061; H04L 1/0072; H04L 1/1896
(Continued)

(56) References Cited

U.S. PATENT DOCUMENTS

2007/0058565 A1\* 3/2007 Wiatrowski .......... H04W 28/06
370/252
2011/0246865 A1 10/2011 Wen
(Continued)

FOREIGN PATENT DOCUMENTS

CN 101594205 A 12/2009
CN 101689964 A 3/2010
(Continued)

OTHER PUBLICATIONS

"3rd Generation Partnership Project; Technical Specification Group Radio Access Network; NR; Multiplexing and channel coding (Release 15)," 3GPP TS 38.212 V15.3.0, total 99 pages, 3rd Generation Partnership Project, Valbonne, France (Sep. 2018).
(Continued)

*Primary Examiner* — Christopher R Crompton
(74) *Attorney, Agent, or Firm* — Leydig, Voit & Mayer, Ltd.

(57) ABSTRACT

A transmitting device and a receiving device for reliable reception of control messages such as downlink control information is provided. The transmitting device forms a control message which comprises control information, a first CRC word (W1) and a second CRC word (W2). The control message is sent to the receiving device which obtains a first CRC check outcome based on performing a first CRC check on the control message, and a second CRC check outcome based on performing a second CRC check on the control message. Thereby, more reliable reception of control messages is possible. Furthermore, the present application also relates to corresponding methods and a computer program.

13 Claims, 9 Drawing Sheets

(58) Field of Classification Search
USPC .......................................................... 370/216
See application file for complete search history.

(56) References Cited

U.S. PATENT DOCUMENTS

| | | | |
|---|---|---|---|
| 2013/0148623 A1 | 6/2013 | Nishio et al. | |
| 2017/0366199 A1* | 12/2017 | Ge | H03M 13/09 |
| 2018/0131474 A1* | 5/2018 | Berggren | H04L 1/1614 |
| 2018/0199317 A1* | 7/2018 | Hwang | H04L 1/0061 |

FOREIGN PATENT DOCUMENTS

| | | |
|---|---|---|
| CN | 103491644 A | 1/2014 |
| CN | 106688204 A | 5/2017 |
| CN | 108029130 A | 5/2018 |
| CN | 108540140 A | 9/2018 |
| CN | 108631950 A | 10/2018 |
| WO | 2018143772 A1 | 8/2018 |
| WO | 2020088751 A1 | 5/2020 |

OTHER PUBLICATIONS

Huawei et al., "L1 enhancements for URLLC," 3GPP TSG RAN WG1 Meeting #94bis, Chengdu, China, R1-1810157, total 15 pages, 3rd Generation Partnership Project, Valbonne, France (Oct. 8-12, 2018).

Panasonic, "On NR URLLC L1 enhancements," 3GPP TSG RAN WG1 Meeting #94bis, Chengdu, China, R1-1810474, total 9 pages, 3rd Generation Partnership Project, Valbonne, France (Oct. 8-12, 2018).

\* cited by examiner

TRANSMITTING AND RECEIVING DEVICES FOR RELIABLE RECEPTION OF CONTROL MESSAGES

CROSS-REFERENCE TO RELATED APPLICATIONS

This application is a continuation of International Patent Application No. PCT/EP2018/079812, filed on Oct. 31, 2018, the disclosure of which is hereby incorporated by reference in its entirety.

TECHNICAL FIELD

The present application relates to a transmitting device and a receiving device for reliable reception of control messages. Furthermore, the present application also relates to corresponding methods and a computer program.

BACKGROUND

In mobile wireless cellular systems, such as 3GPP LTE and NR, each downlink/uplink (DL/UL) data transmission is preceded by a DL control information (DCI) message that informs the DL receiver/UL transmitter about the transmission parameters to be used for reception/transmission of a subsequent data message. The transmission parameters can e.g. relate to modulation, FEC code rate, time-frequency resources, etc. The control information message is usually transmitted in a pre-defined set of time-frequency resources called Control Resource Set (CORESET) in 3GPP NR. A control transmission uses a subset of the CORESET time-frequency resources; each of the CORESET subsets that may carry a control message is called PDCCH candidate in NR and LTE.

The DCI encoding can be summarized as follows: in the transmitter, the gNB PDCCH encoder—based on the DCI format and number of available time-frequency (TF) resources—determines the mother polar code size, the frozen bits and the rate-matching scheme needed to produce the number of coded bits needed to fill all the TF resources. Then, based on the DCI, the gNB computes a CRC word, scrambles the CRC word with a user identity (e.g., RNTI) and then appends the scrambled CRC word to the DCI, thereby forming a control packet. The control packet is then FEC-encoded, modulated and mapped to the TF resource in a PDCCH candidate chosen by gNB.

The receiver has prior knowledge of all the PDCCH candidates, but it has no prior knowledge regarding whether each PDCCH candidate contains a control transmission nor regarding the transmission scheme (code rate and DCI size) possibly used in that PDCCH candidate. Thus, for each PDCCH candidate, the receiver has to perform several blind decoding (BD) attempts—one for each transmission scheme (known as DCI format in specification) that could possibly be used by the transmitter. For each BD attempt, the receiver checks whether the obtained decoded message is valid by means of a CRC word appended to the control message.

In the receiver, before performing BD on a given PDCCH candidate, the UE PDCCH decoder assumes that a given DCI format was transmitted, determines the mother polar code size, the frozen bits and the rate-matching scheme in the same way as the PDCCH encoder would have done, then performs polar decoding and checks CRC. PDCCH BD attempts are performed in the UE. Thus, for any given PDCCH candidate, the UE has to perform one BD attempt for each expected DCI size. As UEs have typically limited power, it is desirable to keep the number of BD attempts—thus the number of DCI sizes—to a minimum.

Validation of the decoded message is typically performed by checking the CRC word. Validation is performed in the receiver by computing a new CRC word based on the decoded packet and on the same rules that the gNB used to compute the CRC word in the received control packet. Then, the new CRC word is scrambled by user identity and checked whether it matches with the scrambled CRC in the received control packet. If there is match, the control message is considered valid and then used for configuring the DL receiver/UL transmitter for a subsequent data reception/transmission.

Any FEC decoder is designed to correct errors in the received control information word. However, there is a non-negligible probability that the decoded control packet contains residual errors. This typically happens when SINR of the received signal is low. Very often, presence of residual errors in the decoded control packet is detected by the CRC circuit, thereby invalidating the control information message. Less often, but non-negligibly so, the erroneous decoded control message passes CRC check. This constitutes a so-called false-alarm (FA) event, and the rate of occurrence of such events is called false alarm rate (FAR).

Ultra-reliable and low-latency communication (URLLC) targets transmission with very low error rates and/or within a guaranteed short delay. FA events are particularly disruptive for low latency in the DL as they trigger a fake data reception that interferes with the flow of valid data packets. An invalid data reception may corrupt the receiver's soft buffer, thereby causing further delays in the delivery of the affected data packet. Even worse, FA events are disruptive for UL transmission as the UE may incorrectly assume— according to invalid control information—that it is allowed to transmit in certain time-frequency resources while the same resources are actually assigned to other UEs. That might cause a high level of interference.

Thus, it is beneficial to keep the rate of false-alarm events as low as possible in order to achieve the target performances of URLLC transmissions.

SUMMARY

An objective of embodiments of the present application is to provide a solution which mitigates or solves the drawbacks and problems of conventional solutions.

Another objective of embodiments of the present application is to provide a solution having lower control message error rate compared to conventional solutions. Especially, reduction of the rate of false-alarm events in blind decoding of control information messages is a target.

The above and further objectives are solved by the subject matter of the independent claims. Further advantageous embodiments of the present application can be found in the dependent claims.

According to a first aspect of the present application, the above mentioned and other objectives are achieved with a transmitting device for a wireless communication system, the transmitting device being configured to obtain a first cyclic redundancy check, CRC, word based on encoding a control information using a first CRC generator polynomial;

obtain a second CRC word based on encoding the control information or encoding the control information together with the first CRC word using a second CRC generator polynomial;

form a control message based on the control information, the first CRC word and the second CRC word;

transmit the control message to a receiving device.

In one example, the first CRC word and the second CRC word are determined by the transmitting device.

The first CRC generator polynomial and the second CRC generator polynomial can e.g. be given by a standard, such as LTE and NR.

An advantage of the network access node according to the first aspect is that the second CRC word provides increased error detection capability, thereby obtaining improved transmission reliability compared to conventional solutions. Thereby, e.g. reduced false-alarm events is achieved.

In an implementation form of a transmitting device according to the first aspect, the control information comprises a plurality of information bit fields, and the transmitting device is configured to obtain the first CRC word based on encoding at least a part of a bit field using the first CRC generator polynomial.

A bit field generally comprises a plurality of bits. In this implementation form only a part of the bits are encoded.

An advantage with this implementation form is that not all bits of a bit field has to be used which means improved flexibility when encoding the control information.

In an implementation form of a transmitting device according to the first aspect, the transmitting device is configured to replace bits of the bit field with the first CRC word so as to obtain the control information with embedded first CRC word;

obtain the second CRC word based on encoding the control information with the embedded first CRC word using the second CRC generator polynomial;

form the control message based on appending the second CRC word to the control information with the embedded first CRC word.

An advantage with this implementation form is that the insertion of the second CRC word does not increase the size of the control message. A further advantage is that the receiving device does not need to know in advance whether there is a second CRC word embedded in the control information or not as the receiving device is able to autonomously determine the presence of a second CRC word upon detection of New Data Indication (NDI) after having decoded the first CRC word.

In an implementation form of a transmitting device according to the first aspect, the transmitting device is configured to replace bits of the bit field with padded bits so as to obtain the control information with embedded padded bits;

obtain the first CRC word based on encoding the control information with the embedded padded bits using the first CRC generator polynomial;

append the first CRC word to the control information.

Appending a CRC word to a control message can in this disclosure be understood to mean that a new message is formed using all the bits in the control message in the same order as they appear in the control message, followed by all the bits in the CRC word in the same order as they appear in the CRC word.

An advantage with this implementation form is that embedding padded bits in the control message provides an occasion to convey further information.

In an implementation form of a transmitting device according to the first aspect, the transmitting device is configured to obtain the second CRC word based on encoding the control information with the embedded padded bits using the second CRC generator polynomial; or obtain the second CRC word based on encoding the control information with the embedded padded bits together with the appended first CRC word using the second CRC generator polynomial.

An advantage with this implementation form is that the transmitting device can choose whether the second CRC word protects the control information and the first CRC word or only the control information. In the latter case, encoding of first and second CRC words can be carried out simultaneously, i.e., second CRC encoding does not need to wait for end of the first CRC encoding.

In an implementation form of a transmitting device according to the first aspect, the transmitting device is configured to form the control message based on replacing the embedded padded bits with the second CRC word.

An advantage with this implementation form is that the second CRC word does not require additional resources for its transmission.

In an implementation form of a transmitting device according to the first aspect, the transmitting device is configured to adapt a bit length of the embedded first CRC word or the embedded second CRC word to be equal to a bit length of the bit field.

An advantage with this implementation form is that the bit length of the first CRC word or the second CRC word is adapted to fit into the bit field.

In an implementation form of a transmitting device according to the first aspect, adapt the bit length of the embedded first CRC word or the embedded second CRC word comprises at least one of puncture bits of the embedded first CRC word or the embedded second CRC word; and repeat bits of the embedded first CRC word or the embedded second CRC word.

In an implementation form of a transmitting device according to the first aspect, the transmitting device is configured to append the first CRC word to the control information;

obtain the second CRC word based on encoding the control information or the control information together with the appended first CRC word using the second CRC generator polynomial.

An advantage with this implementation form is that the transmitting device can choose whether the second CRC word protects the control information and the first CRC word or only the control information. In the latter case, encoding of first and second CRC words can be carried out simultaneously, i.e., second CRC encoding does not need to wait for end of the first CRC encoding.

In an implementation form of a transmitting device according to the first aspect, the transmitting device is configured to form the control message based on appending the second CRC word to the control information and the appended first CRC word.

An advantage with this implementation form is that the second CRC word provides additional error detection capability without using DCI resources.

In an implementation form of a transmitting device according to the first aspect, the transmitting device is configured to CRC scramble at least one of the first CRC word and the second CRC word using an identity of the receiving device.

An advantage with this implementation form is that the scrambled CRC words provide an easy way of addressing control information to a receiving device.

In an implementation form of a transmitting device according to the first aspect, the control information is downlink control information, DCI.

According to a second aspect of the present application, the above mentioned and other objectives are achieved with a receiving device for a wireless communication system, the receiving device being configured to receive a control message from a transmitting device, wherein the control message comprises control information, a first CRC word and a second CRC word;

obtain a first CRC check outcome based on performing a first CRC check on the control message;

obtain a second CRC check outcome based on performing a second CRC check on the control message.

An advantage of the receiving device according to the second aspect is that the second CRC word provides increased error detection capability, thereby obtaining improved transmission reliability compared to conventional solutions. Thereby, e.g. reduced false-alarm events is achieved.

In an implementation form of a receiving device according to the second aspect, the receiving device is configured to perform the second CRC check on the control message upon determining that the control message is associated with a retransmission.

An advantage with this implementation form is that initial HARQ transmissions can be performed according to a conventional control message format, while the second CRC check is used only when needed, i.e., on retransmissions.

In an implementation form of a receiving device according to the second aspect, the receiving device is configured to perform the first CRC check on the first CRC word which is appended to the control information; and subsequently perform the second CRC check on the second CRC word which is embedded in the control information.

An advantage with this implementation form is that embedding the second CRC word into the control message provides additional error detection capability without occupying DCI resources.

In an implementation form of a receiving device according to the second aspect, the receiving device is configured to perform the first CRC check on the first CRC word which is appended to the control information; and subsequently perform the second CRC check on the second CRC word which is appended to the control information.

An advantage with this implementation form is that appending the second CRC word to the control message provides additional error detection capability without occupying DCI resources.

According to a third aspect of the present application, the above mentioned and other objectives are achieved with a method for a transmitting device, the method comprises obtaining a first cyclic redundancy check, CRC, word based on encoding a control information using a first CRC generator polynomial;

obtaining a second CRC word based on encoding the control information or encoding the control information together with the first CRC word using a second CRC generator polynomial;

forming a control message based on the control information, the first CRC word and the second CRC word;

transmitting the control message to a receiving device.

The method according to the third aspect can be extended into implementation forms corresponding to the implementation forms of the transmitting device according to the first aspect. Hence, an implementation form of the method comprises the feature(s) of the corresponding implementation form of the transmitting device.

The advantages of the methods according to the third aspect are the same as those for the corresponding implementation forms of the transmitting device according to the first aspect.

According to a fourth aspect of the present application, the above mentioned and other objectives are achieved with a method for a receiving device, the method comprises receiving a control message from a transmitting device, wherein the control message comprises control information, a first CRC word and a second CRC word;

obtaining a first CRC check outcome based on performing a first CRC check on the control message;

obtaining a second CRC check outcome based on performing a second CRC check on the control message.

The method according to the fourth aspect can be extended into implementation forms corresponding to the implementation forms of the receiving device according to the second aspect. Hence, an implementation form of the method comprises the feature(s) of the corresponding implementation form of the receiving device.

The advantages of the methods according to the fourth aspect are the same as those for the corresponding implementation forms of the receiving device according to the second aspect.

The present application also relates to a computer program, characterized in program code, which when run by at least one processor causes said at least one processor to execute any method according to embodiments of the present application. Further, the present application also relates to a computer program product comprising a computer readable medium and said mentioned computer program, wherein said computer program is included in the computer readable medium, and comprises of one or more from the group: ROM (Read-Only Memory), PROM (Programmable ROM), EPROM (Erasable PROM), Flash memory, EEPROM (Electrically EPROM) and hard disk drive.

Further applications and advantages of the embodiments of the present application will be apparent from the following detailed description.

BRIEF DESCRIPTION OF THE DRAWINGS

The appended drawings are intended to clarify and explain different embodiments of the present application, in which.

DETAILED DESCRIPTION

In LTE and NR cellular systems, downlink control information (DCI) messages are sent in the DL to inform the DL receiver or the UL transmitter about the transmission parameters, e.g., modulation, FEC code rate, time-frequency resources, to be used for reception or transmission of a subsequent data message. Conventionally, a CRC word is computed based on the DCI message and appended to the DCI thereby obtaining a control packet. The obtained control packet, i.e. DCI plus the CRC word, is then FEC-encoded and transmitted.

When the decoded control packet contains residual FEC-decoding errors, very often CRC check does not pass, thereby invalidating the control information message. Less often, but non-negligibly so, the erroneous FEC-decoded control packet passes CRC check, thereby resulting in a false-alarm event. In order to reduce the probability of false-alarm, the inventors herein propose to provide a second CRC word which can be jointly FEC-encoded with the control packet and transmitted to the receiver. Using an additional second CRC word provides better error detection capability compared to conventional solutions where there is only one CRC word. For correct reception, both CRC words have to be checked at the receiver.

Figure 1:
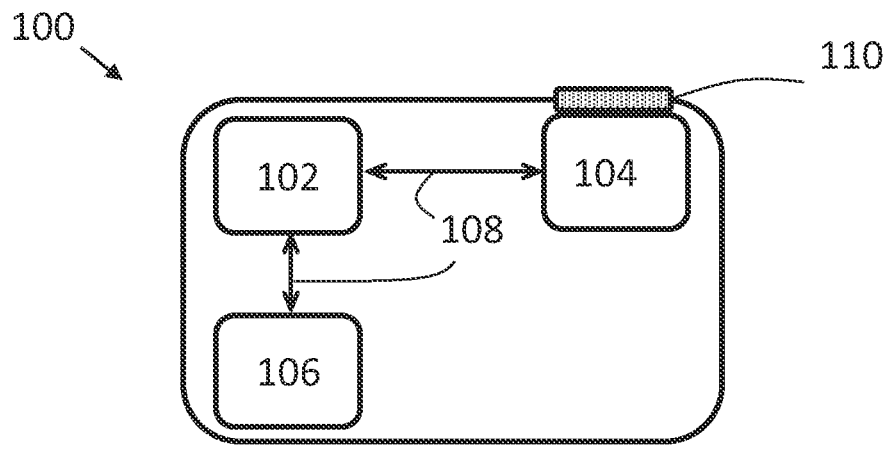
FIG. 1 shows a transmitting device according to an embodiment of the present application.

FIG. 1 therefore shows a transmitting device 100 according to an embodiment of the present application. In the embodiment shown in FIG. 1, the transmitting device 100 comprises a processor 102, a transceiver 104 and a memory 106. The processor 102 is coupled to the transceiver 104 and the memory 106 by communication means 108 known in the art. The transmitting device 100 may be configured for both wireless and wired communications in wireless and wired communication systems, respectively. The wireless communication capability is provided with an antenna or antenna array 110 coupled to the transceiver 104, while the wired communication capability is provided with a wired communication interface 112 coupled to the transceiver 104. That the transmitting device 100 is configured to perform certain actions can in this disclosure be understood to mean that the transmitting device 100 comprises suitable means, such as e.g. the processor 102 and the transceiver 104, configured to perform said actions.

Figure 6:
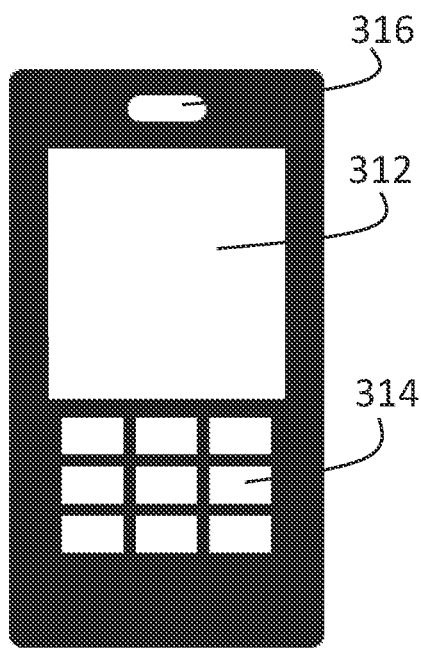
FIG. 6 shows a wireless communication system according to an embodiment of the present application.

According to embodiments of the present application, the transmitting device 100 is configured to obtain a first CRC word based on encoding a control information using a first CRC generator polynomial. The transmitting device 100 is further configured to obtain a second CRC word based on encoding the control information or encoding the control information together with the first CRC word using a second CRC generator polynomial. The transmitting device 100 is further configured to form a control message 510 based on the control information, the first CRC word and the second CRC word. The transmitting device 100 is further configured to transmit the control message 510 to a receiving device 300 as shown in FIG. 6.

In an embodiment of the present application, the transmitting device 100 is a network access node, such as a gNB.

Figure 2:
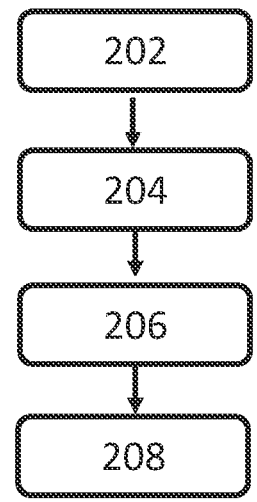
FIG. 2 shows a method for a transmitting device according to an embodiment of the present application.

FIG. 2 shows a flow chart of a corresponding method 200 which may be executed in a transmitting device 100, such as the one shown in FIG. 1. The method 200 comprises obtaining 202 a first CRC word based on encoding a control information using a first CRC generator polynomial. The method 200 further comprises obtaining 204 a second CRC word based on encoding the control information or encoding the control information together with the first CRC word using a second CRC generator polynomial. The method 200 further comprises forming 206 a control message 510 based on the control information, the first CRC word CRC1 and the second CRC word. The method 200 further comprises transmitting 208 the control message 510 to a receiving device 300.

Figure 3:
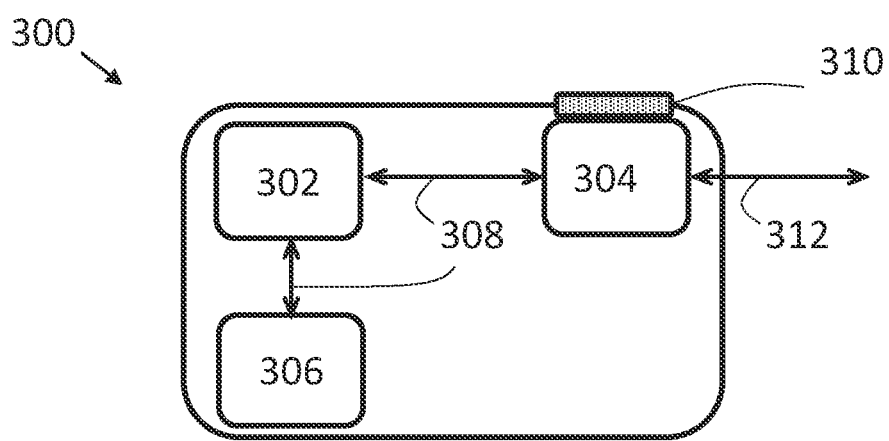
FIG. 3 shows a receiving device according to an embodiment of the present application.

FIG. 3 shows a receiving device 300 according to an embodiment of the present application. In the embodiment shown in FIG. 3, the receiving device 300 comprises a processor 302, a transceiver 304 and a memory 306. The processor 302 is coupled to the transceiver 304 and the memory 306 by communication means 308 known in the art. The receiving device 300 further comprises an antenna or antenna array 310 coupled to the transceiver 304, which means that the receiving device 300 is configured for wireless communications in a wireless communication system. That the receiving device 300 is configured to perform certain actions can in this disclosure be understood to mean that the receiving device 300 comprises suitable means, such as e.g. the processor 302 and the transceiver 304, configured to perform said actions.

According to embodiments of the present application, the receiving device 300 is configured to receive a control message 510 from a transmitting device 100, wherein the control message 510 comprises control information, a first CRC word and a second CRC word. The receiving device 300 is further configured to obtain a first CRC check outcome based on performing a first CRC check on the control message 510. The receiving device 300 is further configured to obtain a second CRC check outcome based on performing a second CRC check on the control message 510.

Figure 4:
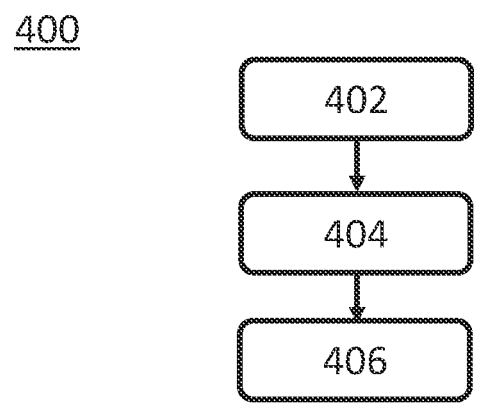
FIG. 4 shows a method for a receiving device according to an embodiment of the present application.

FIG. 4 shows a flow chart of a corresponding method 400 which may be executed in a receiving device 300, such as the one shown in FIG. 3. The method 400 comprises receiving 402 a control message 510 from a transmitting device 100, wherein the control message 510 comprises control information, a first CRC word and a second CRC word. The method 400 further comprises obtaining 404 a first CRC check outcome based on performing a first CRC check on the control message 510. The method 400 further comprises obtaining 406 a second CRC check outcome based on performing a second CRC check on the control message 510.

Figure 5:
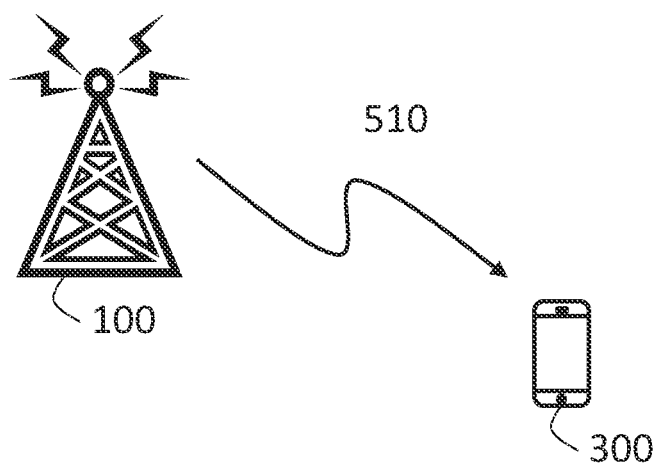
FIG. 5 shows a mobile device according to an embodiment of the present application.

In an embodiment of the present application, the receiving device 300 is a client device, such as a UE. FIG. 5 illustrates a non-limiting example of a client device in the form of a so called mobile device. The mobile device houses at least one processor 302 (see FIG. 1), at least one display device 312, and at least one communications means (not shown in FIG. 6). The mobile device further comprises input means e.g. in the form of a keyboard 314 communicatively connected to the display device 312. The mobile device further comprises output means e.g. in the form of a speaker 316. The mobile device may be a mobile phone, a tablet PC, a mobile PC, a smart phone, a standalone mobile device, or any other suitable communication device.

FIG. 6 shows a wireless communication system 500 according to an embodiment of the present application. The wireless communication system 500 comprises a transmitting device 100 in the form of a network access node 100 and a receiving device in the form of a client device 300 configured to operate in the wireless communication system 500. For simplicity, the wireless communication system 500 illustrated in FIG. 5 only comprises one network access node 100 and one client device 300. However, the wireless communication system 500 may comprise any number of network access nodes 100 and any number of client devices 300 without deviating from the scope of the present application. In the wireless communication system 500, the network access node 100 is configured to transmit a control message 510 to the client device 300. The control message 510 can be an encoded DCI which is associated with a PDCCH. After transmission of the control message 510 UL and/or DL data transmission may be performed between the network access node 100 and the client device 300, e.g. in a physical shared channel.

In the following disclosure, further embodiments of the present application with respect to CRC encoding are presented with reference to FIGS. 7 to 12. In these embodiments the control information is herein in the form of DCI without limiting the scope of the present application. The DCI comprises a plurality of bit fields denoted $f_1, \ldots, f_n, \ldots, f_N$, where n is an arbitrary sub-index. Further, in the FIGS. 7 to 12 the "$ENC_{gp1}$" and "$ENC_{gp1}$", respectively, denotes the encoding operators using first gp1 and second gp2 generator polynomials, respectively. Moreover, the first CRC word is denoted W1 and the second CRC word is denoted W2 in FIGS. 7 to 12.

Figure 7:
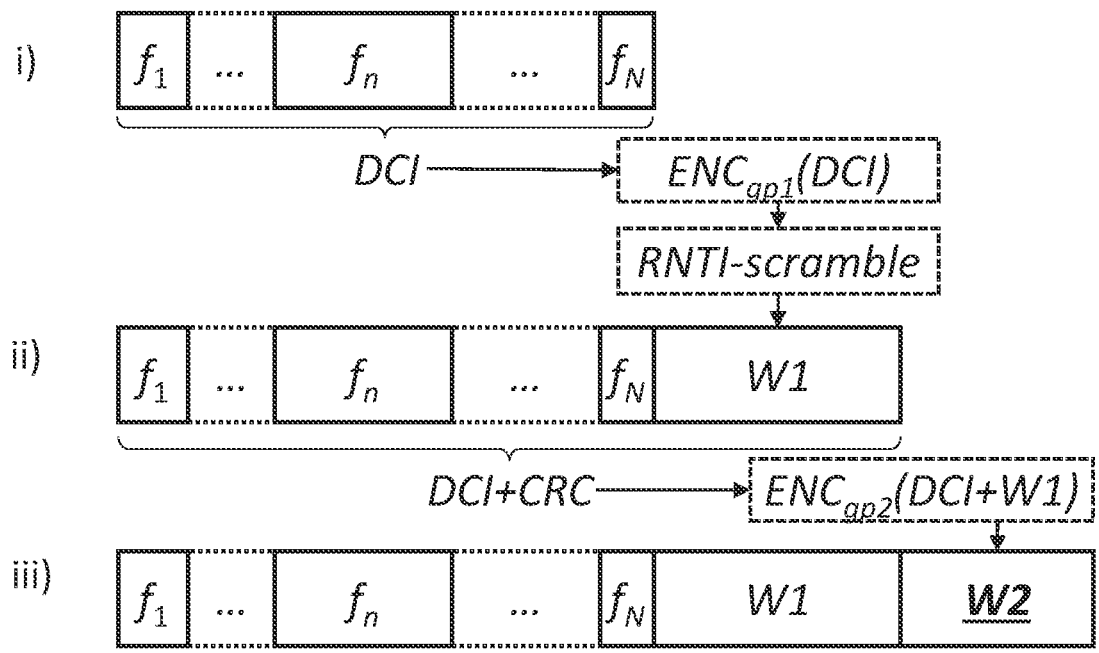
FIG. 7 illustrates CRC encoding of DCI according to an embodiment of the present application.
Figure 8:
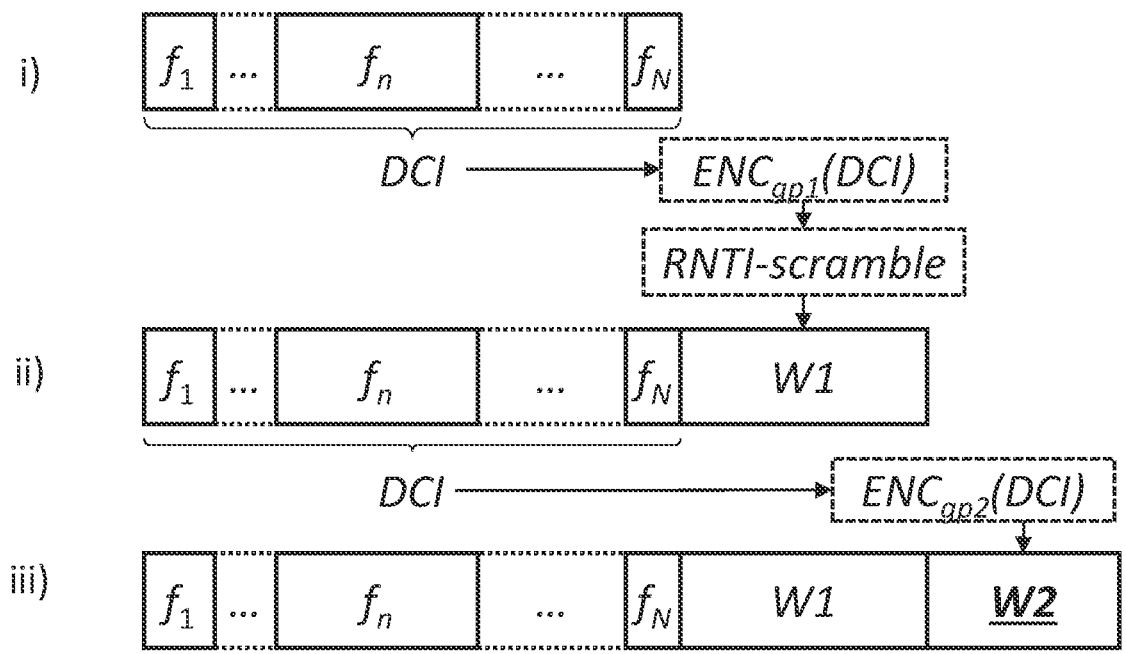
FIG. 8 illustrates CRC encoding of DCI according to an embodiment of the present application.

In an embodiment of the present application, in order to provide additional protection against false alarm events, a second CRC word is obtained by further CRC encoding the DCI and append the second CRC word to the DCI as shown in FIGS. 7 and 8. In this embodiment, the transmitting device 100 is configured to append the first CRC word W1 to the control information, and to obtain the second CRC word W2 based on encoding the control information or the control information together with the appended first CRC word W1 using a second CRC generator polynomial. Thereafter, the transmitting device forms the control message 510 based on appending the second CRC word W2 to the control information and the appended first CRC word W1.

The first CRC word W1 is obtained by encoding the DCI using a first generator polynomial gp1 as illustrated in step i) in FIGS. 7 and 8 with the module "$ENC_{gp1}(DCI)$". In an embodiment the first CRC word W1 is scrambled with the RNTI of the receiving device 300 and appended to the DCI illustrated with the module "RNTI-scramble". In conventional DCI transmission, the network access node scrambles the CRC word by user identity (RNTI). The size of conventional CRC word has been designed to match the size of user identity—24 bits. As the size of the second CRC word W2 is typically smaller and variable depending on the size of DCI field, it would be impractical to scramble the second CRC word W2 with user identity. For that reason, the second CRC word W2 is not scrambled with the user identity in this embodiment.

According to a first alternative of this embodiment, the second CRC word W2 is obtained by further CRC encoding the DCI plus the first CRC word W1 which is shown in FIG. 7. According to this alternative the transmitting device 100 is configured to append the first CRC word W1 to the DCI at step ii) in FIG. 7. The transmitting device 100 obtains the second CRC word W2 by encoding the DCI together with the appended first CRC word W1 using the second CRC generator polynomial illustrated with the module "$ENC_{gp2}(DCI+W1)$".

According to a second alternative of this embodiment, the second CRC word W2 is obtained by further CRC encoding the DCI which is shown in FIG. 8. According to this alternative the transmitting device 100 is configured to append the first CRC word W1 to the DCI at step ii) in FIG. 8. The transmitting device 100 obtains the second CRC word W2 based on only encoding the DCI without the first CRC word W1 illustrated with the module "$ENC_{gp2}(DCI)$".

The second CRC word W2 is appended to the DCI and the first CRC word W1, i.e. appended after the first CRC word W1 as shown in FIGS. 7 and 8 to form the control message 510 at step iii). Mentioned control message 510 is then FEC-encoded and transmitted to the receiving device 300. In this embodiment, it is important that the generator polynomial used to generate the first and second CRC words are different. Otherwise, the second CRC word W2 might be all-zero.

Using a double CRC encoding according to embodiments of the present application provides better error detection capabilities compared to prior art where only one-step CRC is used. As two step CRC encoding is used in transmission, for correct reception both CRCs should be correctly checked.

The DCI in LTE and NR comprises a plurality of different bit fields $f_1, \ldots, f_n, \ldots, f_N$ and each bit field relates to a transmission parameter given by the relevant standard. In some circumstances, the control information contained in at least one of the DCI fields is not used by the receiving device 300. Thus, that DCI field can be reused for different purposes, e.g., to send a CRC word. For example, the frequency resource domain allocation (FDRA) field in the DCI scheduling retransmissions is not necessary when a retransmission profile is configured in the UE in NR. By reusing the unused FDRA field for the purpose of reducing FAR, the DCI size remains the same and therefore there is no increased number of BD attempts. As a second example, we consider the case where some DCI field is not fully used. The unused bits in the partially occupied DCI field can therefore be re-used for additional CRC transmission. According to an embodiment of the present application, the content of one of the DCI fields can be compressed to obtain fewer bits than in the predefined DCI format. This can be done, e.g., by using a coarser frequency-domain allocation granularity for FDRA. Thus, one field in the DCI is partially used for its original purpose. The remaining part of that DCI field can be repurposed for sending a CRC word. According to an embodiment of the present application, the transmitting device 100 is configured to obtain the first CRC word W1 based on encoding at least a part of a bit field $f_n$ using the first CRC generator polynomial. Hence, not all bits of a bit field have to be encoded. However, such a case when all bits of a bit field is encoded is not precluded.

Therefore, in an embodiment of the present application, the DCI contains at least one unused bit field and the unused bit field is filled with a first CRC word W1 computed based on the used DCI fields. In case the obtained first CRC word W1 is longer or shorter than the unused DCI bit field, the first CRC word is punctured or extended by repetition in order to obtain a punctured or extended first CRC word having the same length as the unused DCI field. The unused DCI field is then filled with the first CRC word W1 bits so as to obtain a DCI with embedded first CRC word W1. A second CRC word W2 is thereafter computed based on the used DCI fields and the first CRC word W1 and appended to the DCI so as to form a control message 510. In other words, the transmitting device 100 is configured to replace bits of the DCI bit field $f_n$ with the first CRC word W1 so as to obtain the control information with embedded first CRC word W1. The transmitting device 100 obtains the second CRC word W2 based on encoding the control information with the embedded first CRC word W1 using a second CRC generator polynomial. Finally, the control messages 510 is formed based on appending the second CRC word W2 to the control information with the embedded first CRC word W1. The first and second CRC generator polynomials do not have to be different in this embodiment.

Figure 9:
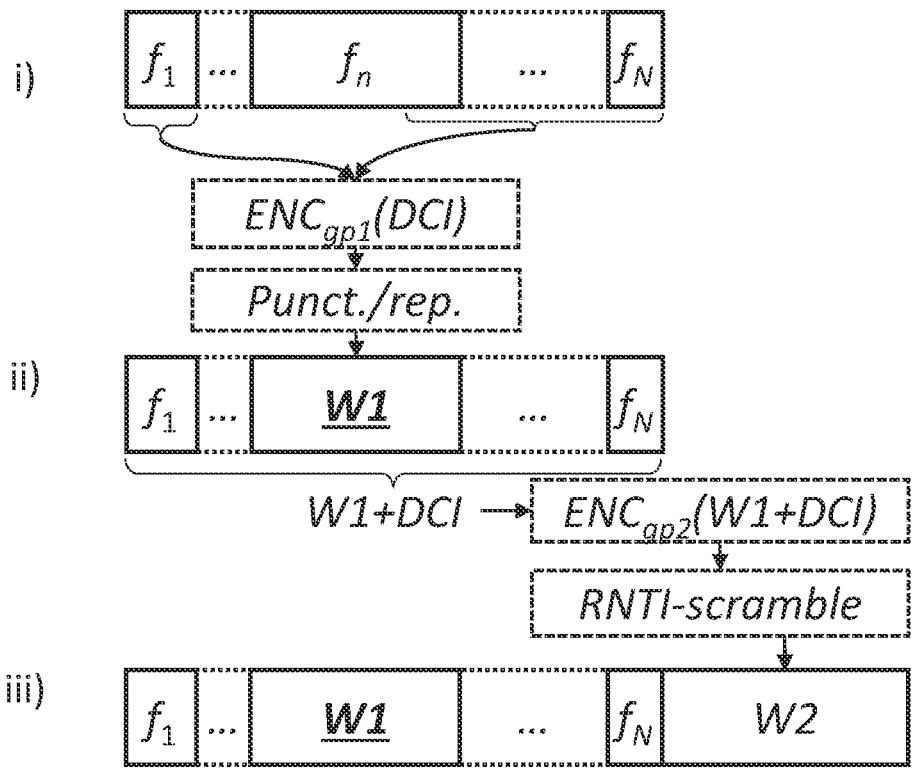
FIG. 9 illustrates CRC encoding of DCI according to an embodiment of the present application.
Figure 10:
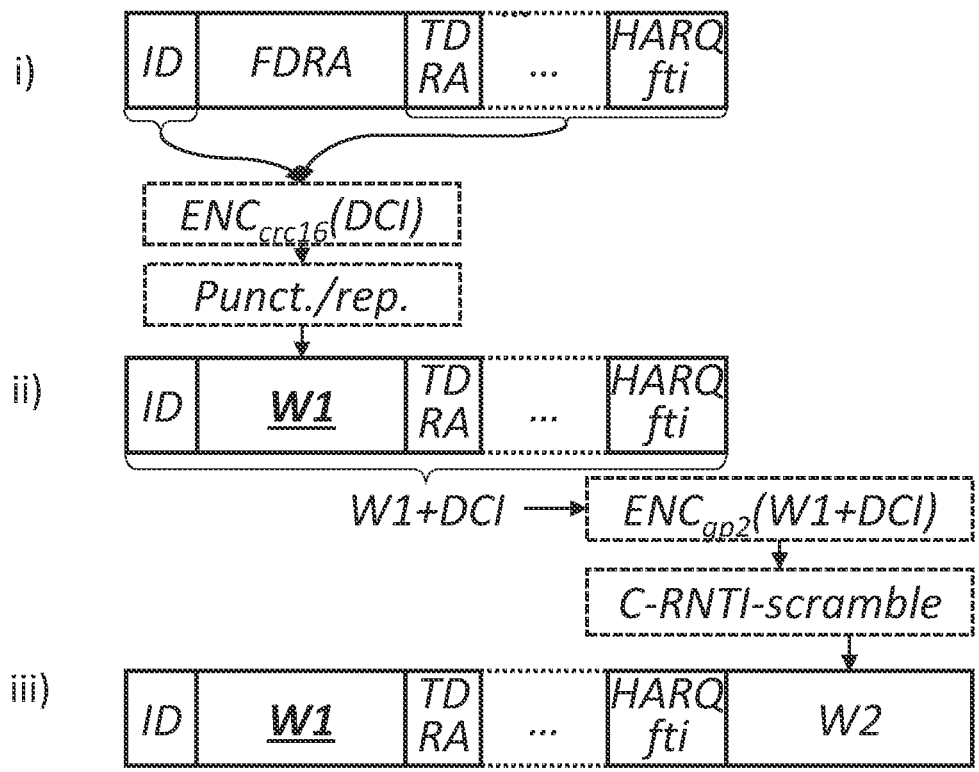
FIG. 10 illustrates CRC encoding of DCI according to an embodiment of the present application.
Figure 11:
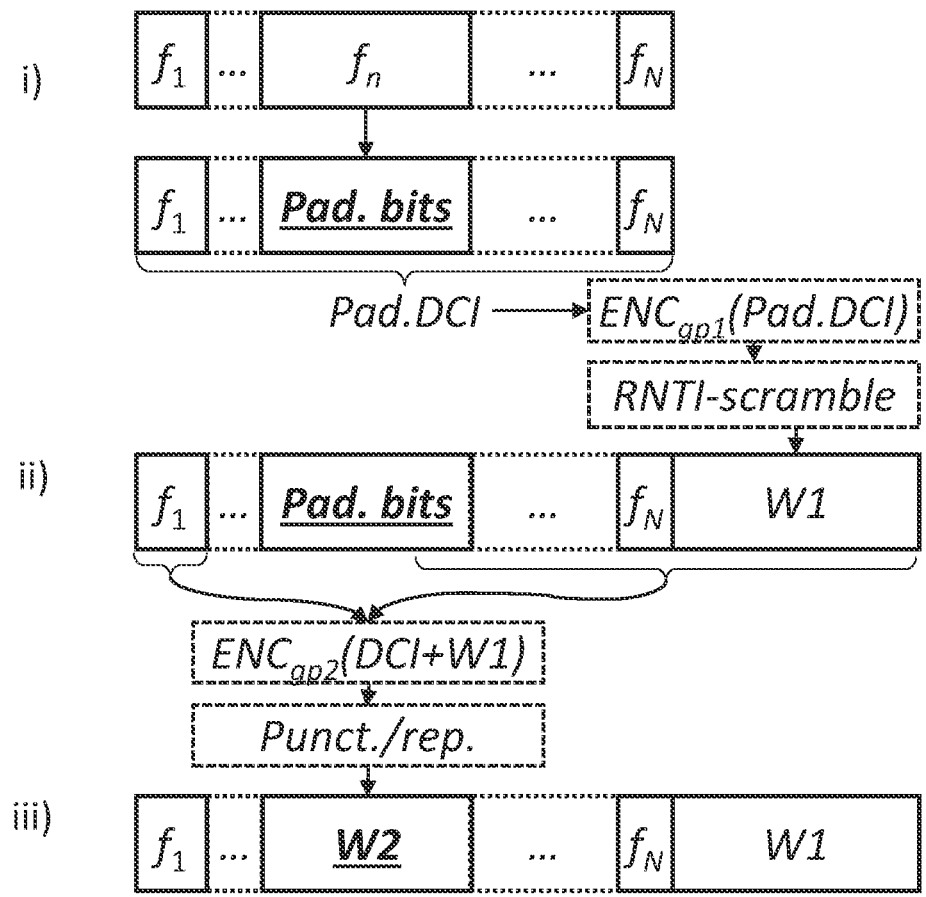
FIG. 11 illustrates CRC encoding of DCI according to an embodiment of the present application.
Figure 12:
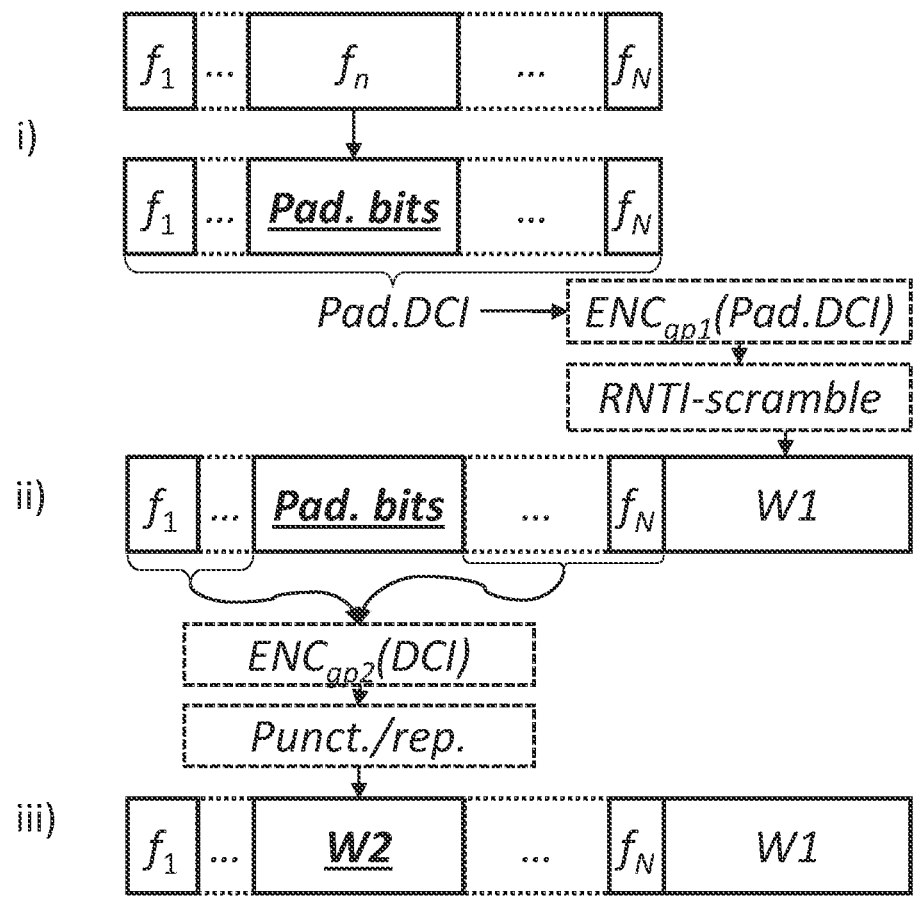
FIG. 12 illustrates CRC encoding of DCI according to an embodiment of the present application.

The procedure according to this embodiment is shown in FIGS. 9 and 10, where $f_n, \ldots, f_N$ indicate DCI bit fields of arbitrary bit length. The transmitting device 100 computes a first CRC word W1 by encoding the DCI in step i) in FIGS. 9 and 10 illustrated with the module "$ENC_{gp1}(DCI)$". The computed first CRC word W1 is punctured and/or bits are repeated in the module "Punct./rep.". Thereafter, the transmitting device 100 replaces bits of the bit field $f_n$ with the first CRC word W1 at step ii) so as to obtain the control information with embedded first CRC word W1.

The second CRC word W2 is obtained based on encoding the DCI with the embedded first CRC word W1 using the second CRC generator polynomial as shown in FIG. 9 and illustrated with the module "$ENC_{gp2}(W1+DCI)$". In an alternative FIG. 10 shows the case when the FDRA bit field in the 3GPP NR DCI Format 1_0 is recipient of embedded first CRC word W1 according to an implementation of the second embodiment. Also, the fields ID, TDRA and HARQ fti are shown, wherein ID is the identifier of the DCI format (UL/DL), TDRA is a time-domain resource allocation, and HARQ fti is a PDSCH-to-HARQ feedback timing indicator.

In both FIGS. 9 and 10 the first CRC word W1 can be scrambled with the RNTI of the receiving device 300 before being embedded in the DCI as previously described.

Finally, the control message 510 is formed based on appending the second CRC word W2 to the control information with the embedded first CRC word W1 as shown in step iii) in FIGS. 9 and 10.

In an embodiment of the present application, the DCI contains unused bit fields. The unused bit field is filled with padding bits according to a predefined bit pattern. A first CRC word W1 is thereafter computed based on the padded DCI message, then scrambled with RNTI and appended to the padded DCI as shown in step i) in FIGS. 11 and 12. According to this embodiment, the transmitting device 100 is configured to replace bits of the DCI bit field $f_n$ with padded bits so as to obtain the control information with embedded padded bits. The transmitting device 100 obtains the first CRC word W1 based on encoding the control information with the embedded padded bits using the first CRC generator polynomial. Then the first CRC word W1 is appended to the control information. The second CRC word W2 is obtained based on encoding the control information with the embedded padded bits using a second CRC generator polynomial; or in an alternative the second CRC word W2 is obtained based on encoding the control information with the embedded padded bits together with the appended first CRC word W1 using the second CRC generator polynomial. Finally, the control message 510 is formed based on replacing the embedded padded bits with the second CRC word W2. The first and second CRC generator polynomials do not have to be different in this embodiment.

According to a first alternative of this embodiment, the first CRC word W1 is obtained based on encoding the control information with the embedded padded bits using the first CRC generator polynomial illustrated with the module "$ENC_{gp1}(Pad.DCI)$". The first CRC word W1 can also be scrambled with the RNTI of the receiving device 300 before being embedded in the DCI. Thereafter, the first CRC word W1 is appended to the DCI as shown in step ii). The second CRC word W2 is thereafter computed based on the used DCI fields and the appended first CRC W1 using the second CRC generator polynomial illustrated with the module "$ENC_{gp2}(DCI+W1)$", so as to obtain a second CRC word W2 having the same length as the unused DCI field. In this respect, the transmitting device 100 replaces bits of the bit field $f_n$ with padded bits so as to obtain the DCI with embedded padded bits. Finally, the control message 510 is formed based on replacing the embedded padded bits with the second CRC word W2.

According to a second alternative of this embodiment, the second CRC word W2 is computed based on the used DCI fields excluding the previously computed first CRC word W1, so as to obtain a second CRC word W2 having the same length as the unused DCI field. This is shown in step ii) in FIG. 12 in which transmitting device 100 replaces bits of the bit field $f_n$ with padded bits so as to obtain the control information with embedded padded bits. The first CRC word (CRC1) is obtained based on encoding the control information with the embedded padded bits using the first CRC generator polynomial illustrated with the module "$ENC_{gp1}(Pad.DCI)$". The first CRC word W1 is append to the control information. The second CRC word W2 is obtained based on encoding the control information with the embedded padded bits using the second CRC generator polynomial illustrated with the module "$ENC_{gp2}(DCI)$". Finally, the control message 510 is formed based on replacing the embedded padded bits with the second CRC word W2. This embodiment is, in general, slightly more complex than the previous described embodiments as it requires the receiver device 300 have prior knowledge of the padding bit sequence and presence of second CRC word W2 in the decoded control packet. Moreover, the receiving device 300 has to perform a double CRC decoding attempt to detect CRC—a first attempt with the decoded packet as provided by the channel decoder, and a second attempt with the content of $f_2$ in the decoded control packet replaced with padding bits. A third CRC decoding is needed to check the second CRC word W2 when present. However, usage of padding bits in the control message 510 might be useful for other purposes, e.g., to convey further information.

Any received control message 510 comprising the first and second CRC word is considered valid after both first and second CRC words checks pass. Therefore, the receiving device 300 is configured to make a double CRC check. However, in embodiments of the present application it has also to be considered whether a data transmission received by the receiving device 300 relates to an initial transmission of symbols or a retransmission of said symbols in the wireless communication system.

Generally, the receiving device 300 performs any of the two following embodiments depending on how the first and second CRC words are located in the control message 510, i.e. appended or embedded.

In an embodiment of the present application, the receiving device 300 is configured to perform the first CRC check on the first CRC word which is appended to the control information; and subsequently perform the second CRC check on the second CRC word which is embedded in the control information.

In another embodiment of the present application, the receiving device 300 is configured to perform the first CRC check on the first CRC word which is appended to the control information; and subsequently perform the second CRC check on the second CRC word which is appended to the control information.

Figure 13:
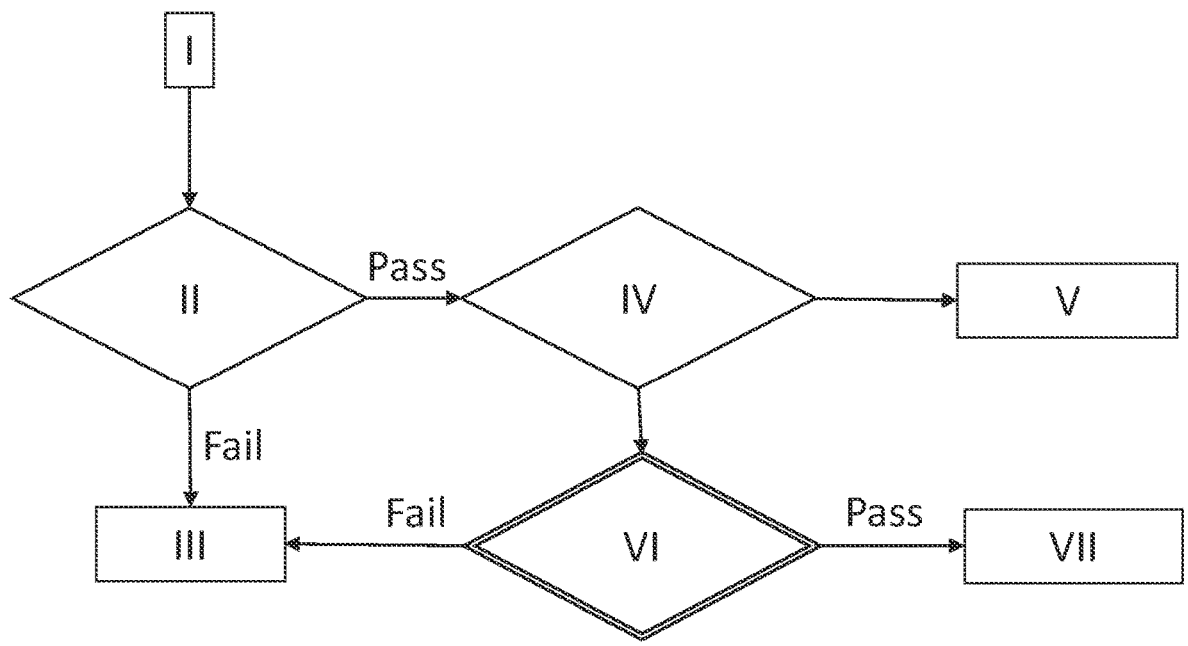
FIG. 13 shows a flow chart at the receiving device according to an embodiment of the present application.

Control message validation is according to an embodiment of the present application are performed according to the following procedure with reference to modules I to VII in FIG. 13:

I. A control message 510 is received by the receiving device 300 from the transmitting device 100, e.g. in a PDCCH.
II. The receiving device 300 performs a first check to obtain a first CRC check outcome based on performing a first CRC check on the control message 510.
III. If the first CRC outcome is a Fail, then the DCI is discarded.
IV. If the first CRC outcome is a Pass, the receiving device 300 detects a new data indicator (NDI) bit in the corresponding DCI field.
V. If the NDI indicates initial transmission, the receiving device 300 performs reception of an initial transmission, e.g. in a PDSCH associated with the PDCCH.
VI. Else the receiving device 300 performs a second check to obtain a second CRC check outcome based on performing a second CRC check on the control message 510. If the second CRC outcome is a Fail, the DCI is discarded.
VII. If the second CRC outcome however is a Pass, the receiving device 300 performs reception of retransmission.

According to the procedure in FIG. 13, the receiving device 300 performs reception of a retransmission only after passing the double CRC check as outlined above. In this way, the retransmission false alarm is reduced. Even in the case a wrong NDI indicates retransmission, e.g., produced by a CRC false alarm event, the second CRC check will fail as the decoded DCI does not contain any second CRC word. It can be noted that the module "VI" shown in FIG. 13 comprises reverse or inverse puncturing or repetition operations compared to the operations performed by the transmitting device 100. Additionally, when padding bits are used, the "VI" module shown in FIG. 13 comprises replacing bits in the received control message with padding bits before performing a CRC check. The additional complexity of a double CRC check is minimal compared to blind decoding. It is further to be noted from FIG. 13 that according to an embodiment of the present application, the transmitting device 100 performs a single CRC procedure for an initial transmission and the double CRC procedure for at least one retransmission. In other words, the receiving device 300 is configured to perform the second CRC check on the control message 510 upon determining that the control message 510 is associated with a retransmission according to this embodiment.

In any of the embodiments of the present application, CRC generator polynomials from 3GPP specification can be used. There are few CRC generator polynomials in the standard, Sect. 5.1, with fixed length (i.e. fixed number of parity bits). As it is desirable to re-use those generator polynomials to generate the embedded first or second CRC word, it becomes needed to provide methods to adapt the length of the generated first or second CRC word to the size of the available DCI fields used for additional CRC transmission.

When the obtained first or second word is longer or shorter than the unused DCI bit field, the obtained first or second CRC word is punctured or extended by repetition in order to obtain a punctured or extended word having the same length as the unused DCI field.

A rule to generate the first or second CRC word is to use the cyclic generator polynomial that has the length (i.e. the number of parity bits) closest to the size of the unused DCI field. If that cyclic generator polynomial has length L larger than the size S of the field, i.e. L>S, then the first or second CRC word is punctured to obtain a punctured first or second CRC word having the same size as the size of unused field. A simple puncturing rule consists in selecting the initial S bits in the first or second word and writing those bits in the unused DCI field. The remaining L−S bits are discarded. If however L<S, bits have to be repeated in order to obtain the same size as the unused field. A repetition rule consists in cyclical extension of the first or second CRC word until the extended first or second CRC word has size S.

The CRC generator polynomial used to generate the first or second CRC word and the puncturing or repetition pattern can be predefined or communicated to the receiving device 300 by semi-static signalling, such as RRC signalling.

Figure 14:
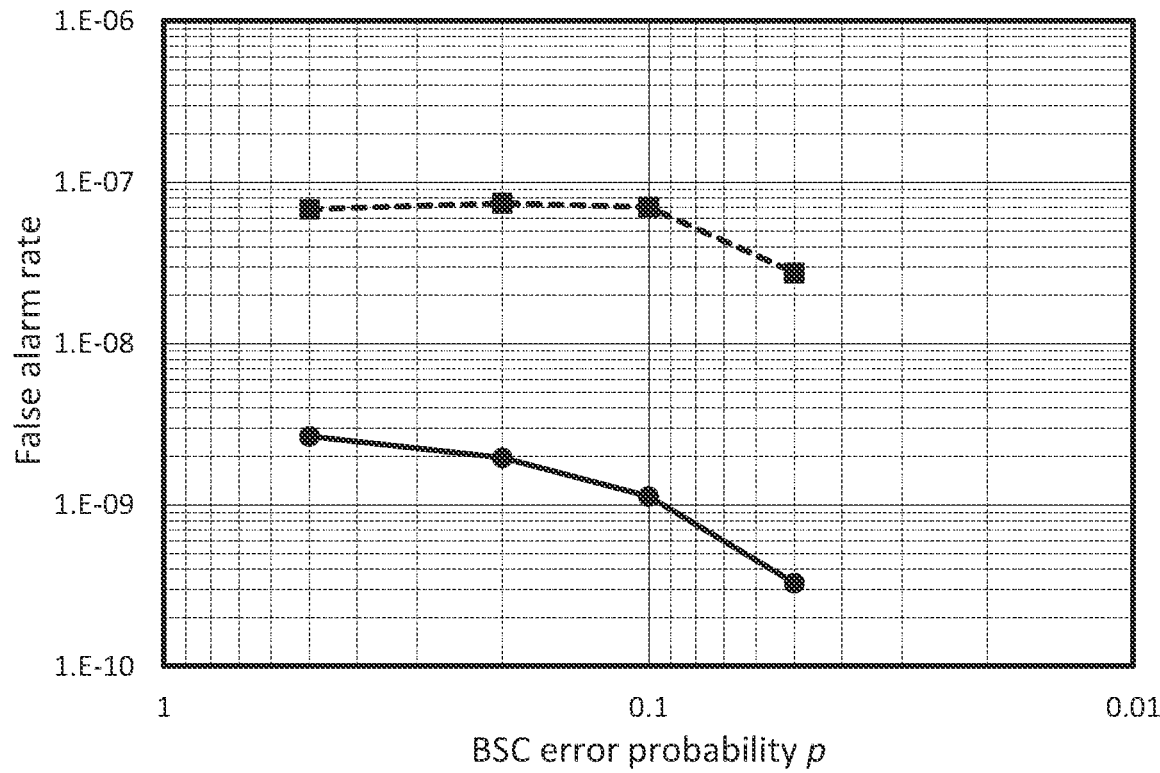
FIG. 14 shows performance results of embodiments of the present application.

The performance of embodiments of the present application has been evaluated via Monte Carlo simulations on a Binary Symmetric Channel (BSC) model with error probability p. The achieved FAR versus BSC error probability p is shown in FIG. 14. Here, FAR is defined as the ratio of FEC-decoded words with errors that pass both the first CRC check and the second CRC check. The total DCI length (including unused field) is 80 bits. An unused FDRA field (as in FIG. 10) of length 6 bits is assumed. For each control message, a first CRC word of size 6 bits is computed based on used DCI fields using the generator polynomial $g_{CRC6}$ from NR specification. The first CRC word is then embedded in the DCI by replacing the FDRA field content with the first CRC word. A 24-bit second CRC word is then computed on the DCI with embedded first CRC word using generator polynomial $g_{CRC24C}$ from NR specification. The second CRC word is thereafter appended to the DCI with embedded first CR word to form a control message for transmission. The performance evaluation results in FIG. 14 show that the FAR of control message transmission with appended 24-bit CRC word and embedded 6-bit CRC word is more than one order of magnitude smaller than the FAR of conventional NR control message transmission with appended 24-bit CRC word.

The transmitting device 100 as a network access node herein may also be denoted as a radio network access node, an access network access node, an access point, or a base station, e.g. a Radio Base Station (RBS), which in some networks may be referred to as transmitter, "gNB", "gNodeB", "eNB", "eNodeB", "NodeB" or "B node", depending on the technology and terminology used. The radio network access node may be of different classes such as e.g. macro eNodeB, home eNodeB or pico base station, based on transmission power and thereby also cell size. The radio network access node can be a Station (STA), which is any device that contains an IEEE 802.11-conformant Media Access Control (MAC) and Physical Layer (PHY) interface to the Wireless Medium (WM). The radio network access node may also be a base station corresponding to the fifth generation (5G) wireless systems.

The receiving device 300 as a client device 300 herein, may be denoted as a user device, a User Equipment (UE), a mobile station, an internet of things (IoT) device, a sensor device, a wireless terminal and/or a mobile terminal, is enabled to communicate wirelessly in a wireless communication system, sometimes also referred to as a cellular radio system. The UEs may further be referred to as mobile telephones, cellular telephones, computer tablets or laptops with wireless capability. The UEs in this context may be, for example, portable, pocket-storable, hand-held, computer-comprised, or vehicle-mounted mobile devices, enabled to communicate voice and/or data, via the radio access network, with another entity, such as another receiver or a server. The UE can be a Station (STA), which is any device that contains an IEEE 802.11-conformant Media Access Control (MAC) and Physical Layer (PHY) interface to the Wireless Medium (WM). The UE may also be configured for communication in 3GPP related LTE and LTE-Advanced, in WiMAX and its evolution, and in fifth generation wireless technologies, such as New Radio.

Furthermore, any method according to embodiments of the present application may be implemented in a computer program, having code means, which when run by processing means causes the processing means to execute the steps of the method. The computer program is included in a computer readable medium of a computer program product. The computer readable medium may comprise essentially any memory, such as a ROM (Read-Only Memory), a PROM (Programmable Read-Only Memory), an EPROM (Erasable PROM), a Flash memory, an EEPROM (Electrically Erasable PROM), or a hard disk drive.

Moreover, it is realized by the skilled person that embodiments of the transmitting device 100 and the receiving device 300 comprises the necessary communication capabilities in the form of e.g., functions, means, units, elements, etc., for performing the solution. Examples of other such means, units, elements and functions are: processors, memory, buffers, control logic, encoders, decoders, rate matchers, de-rate matchers, mapping units, multipliers, decision units, selecting units, switches, interleavers, de-interleavers, modulators, demodulators, inputs, outputs, antennas, amplifiers, receiver units, transmitter units, DSPs, MSDs, TCM encoder, TCM decoder, power supply units, power feeders, communication interfaces, communication protocols, etc. which are suitably arranged together for performing the solution.

Especially, the processor(s) of the transmitting device 100 and the receiving device 300 may comprise, e.g., one or more instances of a Central Processing Unit (CPU), a processing unit, a processing circuit, a processor, an Application Specific Integrated Circuit (ASIC), a microprocessor, or other processing logic that may interpret and execute instructions. The expression "processor" may thus represent a processing circuitry comprising a plurality of processing circuits, such as, e.g., any, some or all of the ones mentioned above. The processing circuitry may further perform data processing functions for inputting, outputting, and processing of data comprising data buffering and device control functions, such as call processing control, user interface control, or the like.

Finally, it should be understood that the present application is not limited to the embodiments described herein, but also relates to and incorporates all embodiments within the scope of the appended independent claims.

What is claimed is:

1. A transmitting device for a wireless communication system, the transmitting device comprising a processor and a memory coupled to the processor and having processor-executable instructions stored thereon, which when executed by the processor, cause the transmitting device to:
replace bits of a bit field ($f_n$) with padded bits to obtain control information with embedded padded bits; wherein the control information before replacing the bits of the bit field $f_n$ with padded bits comprises a plurality of information bit fields ($f_1, \ldots, f_n, \ldots, f_N$),
obtain a first cyclic redundancy check (CRC) word based on encoding the control information with embedded padded bits using a first CRC generator polynomial;
append the first CRC word to the control information with the embedded padded bits: and obtain a second CRC word based on encoding the control information with the embedded padded bits together with the appended first CRC word using a second CRC generator polynomial;
replace the embedded padded bits by the second CRC word to obtain another control information;
form a control message based on the another control information; and
transmit the control message to a receiving device.

2. The transmitting device according to claim 1, wherein the transmitting device is configured to:
obtain the first CRC word based on encoding at least a part of a bit field ($f_n$) using the first CRC generator polynomial.

3. The transmitting device according to claim 2, configured to:
replace bits of the bit field ($f_n$) with the first CRC word so as to obtain the control information embedded in the first CRC word;
obtain the second CRC word based on encoding the control information with the embedded first CRC word using the second CRC generator polynomial; and
form the control message based on appending the second CRC word to the control information with the embedded first CRC word.

4. The transmitting device according to claim 2, configured to:
obtain the first CRC word based on encoding the control information with the embedded padded bits using the first CRC generator polynomial; and
append the first CRC word to the control information.

5. The transmitting device according to claim 4, configured to:
obtain the second CRC word based on encoding the control information with the embedded padded bits using the second CRC generator polynomial; or
obtain the second CRC word based on encoding the control information with the embedded padded bits together with the appended first CRC word using the second CRC generator polynomial.

6. The transmitting device according to claim 5, configured to:
form the control message based on replacing the embedded padded bits with the second CRC W2.

7. The transmitting device according to claim 3, configured to:

adapt a bit length of the embedded first CRC word or the embedded second CRC word to be equal to a bit length of the bit field ($f_n$).

8. The transmitting device according to claim 7, wherein adapting the bit length of the embedded first CRC word or the embedded second CRC word comprises at least one of:
   puncturing bits of the embedded first CRC word or the embedded second CRC word; and
   repeating bits of the embedded first CRC word or the embedded second CRC word.

9. The transmitting device according to claim 1, configured to:
   form the control message based on appending the second CRC word to the control information and the appended first CRC word.

10. The transmitting device according to claim 1, configured to:
    CRC scramble at least one of the first CRC word and the second CRC word using an identity of the receiving device.

11. The transmitting device according to claim 1 wherein the control information is downlink control information (DCI).

12. A method for a transmitting device, the method comprising:
    replacing bits of a bit field ($f_n$) with padded bits to obtain control information with embedded padded bits; wherein the control information before replacing the bits of the bit field $f_n$ with padded bits comprises a plurality of information bit fields ($f_1 \ldots, f_n \ldots f_N$);
    obtaining a first cyclic redundancy check (CRC) word based on encoding the control information with embedded padded bits using a first CRC generator polynomial;
    appending the first CRC word to the control information with the embedded padded bits; and obtain a second CRC word based on encoding the control information with the embedded padded bits together with the appended first CRC word using a second CRC generator polynomial;
    replacing the embedded padded bits by the second CRC word to obtain another control information;
    forming a control message based on the another control information; and
    transmitting the control message to a receiving device.

13. A non-transitory computer readable storage medium storing computer program codes that, when executed by a computer processor, causes a computer to perform the method of claim 12.

* * * * *

UNITED STATES PATENT AND TRADEMARK OFFICE
CERTIFICATE OF CORRECTION

PATENT NO. : 12,155,476 B2
APPLICATION NO. : 17/149462
DATED : November 26, 2024
INVENTOR(S) : Safavi et al.

Page 1 of 1

It is certified that error appears in the above-identified patent and that said Letters Patent is hereby corrected as shown below:

In the Claims

Claim 1: Column 16, Line 21: "the embedded padded bits: and obtain a second CRC" should read as -- the embedded padded bits; and obtain a second CRC --.

Signed and Sealed this
Third Day of June, 2025

Coke Morgan Stewart
*Acting Director of the United States Patent and Trademark Office*